United States Patent
Ma (10) Patent No.: US 9,117,679 B2
(45) Date of Patent: Aug. 25, 2015

(54) ORGANIC LIGHT EMITTING DIODE, TOUCH DISPLAY DEVICE AND METHOD FOR FABRICATING THE SAME

(71) Applicant: BOE TECHNOLOGY GROUP CO., LTD., Beijing (CN)

(72) Inventor: Zhanjie Ma, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/010,916

(22) Filed: Aug. 27, 2013

(65) Prior Publication Data

US 2014/0091286 A1    Apr. 3, 2014

(30) Foreign Application Priority Data

Sep. 28, 2012    (CN) .......................... 2012 1 0372282

(51) Int. Cl.
  *H01L 29/04* (2006.01)
(52) U.S. Cl.
  CPC ...................................... *H01L 29/04* (2006.01)
(58) Field of Classification Search
  CPC . H01L 21/775; H01L 27/12; H01L 29/66757; H01L 29/78621
  USPC ................................................ 257/40, 59, 72
  See application file for complete search history.

(56) References Cited

U.S. PATENT DOCUMENTS

| 7,420,212 B2 * | 9/2008 | Kim et al. ...................... 257/72 |
| 2010/0001639 A1 | 1/2010 | Kim et al. |
| 2011/0012816 A1 | 1/2011 | Kang et al. |

FOREIGN PATENT DOCUMENTS

| CN | 101887904 A | 11/2010 |
| CN | 101958340 A | 1/2011 |
| JP | 2007-147814 A | 6/2007 |
| KR | 10-0870229 B1 | 11/2008 |

OTHER PUBLICATIONS

First Chinese Office Action dated Jan. 2, 2014; Appln. No. 201210372282.9.
Korean Office Action dated Aug. 14, 2014; Appln. No. 10-2013-0114146.
Korean Office Action Appln. No. 10-2013-0114146: Dated Feb. 9, 2015.

* cited by examiner

*Primary Examiner* — Quoc Hoang
(74) *Attorney, Agent, or Firm* — Ladas & Parry LLP (57) ABSTRACT

The invention provides an OLED, a touch display device and method for fabricating the same. The OLED comprises: a substrate; a pixel electrode functioning as a first conducting electrode on the substrate; a first signal electrode and a second signal electrode disposed on the same layer as the pixel electrode; an insulating layer overlaying the first signal electrode and the second signal electrode; an EL layer in the same layer as the insulating layer and overlaying the pixel electrode; a second conducting electrode overlaying at least the EL layer; and an encapsulating layer overlaying at least the second conducting electrode.

13 Claims, 7 Drawing Sheets

ORGANIC LIGHT EMITTING DIODE, TOUCH DISPLAY DEVICE AND METHOD FOR FABRICATING THE SAME

FIELD OF THE ART

Embodiments of the invention relate to the field of display technologies, more particularly, to an organic light emitting diode (OLED), a touch display device and a method for fabricating the same.

BACKGROUND

Flat Panel Display (FPD) devices are widely used due to the advantages of being compact and portable. A main technology for future FPDs is Organic Light Emitting Diode (OLED) display technology. In comparison with Liquid Crystal Display (LCD) technology operated in an overall backlight mode, OLED displays works in a self-luminant mode such that all the pixels in the OLED can emit light. As a result, the OLED displays can notably increase view angles and contrast while reducing power consumption and thickness.

Touch screens as a modern way of inputting has been used as a main input device in various portable electronic products and are gradually replacing conventional mechanical keypad input device. It is expected that an all-touch non-keypad input mode will be eventually realized in such electronic products. The touch screen technology has undergone various development stages, which mainly includes resistive touch screens, capacitive touch screens, optical sensing touch screens, and electromagnetic sensing touch screens. Currently the mainstream touch screens are the resistive touch screens; however, capacitive touch screens are rapidly catching up. The capacitive touch screens generally include self-capacitance touch screens, surface capacitance touch screen, projected capacitance touch screens and so on.

On the other hand, conventional touch screens made of OLEDs are mostly add-on capacitive touch screens, which have the disadvantages of having high cost, low touch sensitivity and low reliability.

SUMMARY

Embodiments of the invention provide an OLED, a touch display device and a method for fabricating the same, which can improve touch sensitivity of the product and reduce production cost.

To meet the above objective, the embodiments of the invention provide the following technical solutions.

An aspect of the invention provides an OLED comprising:
a substrate;
a pixel electrode functioning as a first conducting electrode on the substrate;
a first signal electrode and a second signal electrode disposed on the same layer as the pixel electrode;
an insulating layer overlaying the first signal electrode and the second signal electrode;
an EL layer overlaying the pixel electrode, a laminated layer of the EL layer and the pixel electrode is in the same layer as the insulating layer;
a second conducting electrode overlaying at least the EL layer; and
an encapsulating layer overlaying at least the second conducting electrode.

As an example, the first conducting electrode is of the organic light emitting diode an anode, and the second conducting electrode is a cathode of the organic light emitting diode.

As an example, the OLED further comprises a hole transmission layer disposed between the anode and the EL layer.

As an example, the OLED further comprises an electron transmission layer disposed between the cathode and the EL layer.

As an example, the insulating layer is an organic insulating layer.

As an example, a portion of the second conducting electrode correspondingly located above the first signal electrode and the second signal electrode is removed.

A second aspect of the invention provides a method for fabricating an organic light emitting diode comprising:
forming a first conducting film on a substrate;
forming a pixel electrode as well as a first signal electrode and a second signal electrode through a single patterning process, wherein the pixel electrode functions as a first conducting film;
forming an insulting layer overlaying the pixel electrode as well as the first signal electrode and the second signal electrode;
forming a via hole in the insulating layer above the pixel electrode;
forming an EL layer in the via hole;
forming a second conducting film overlaying the EL layer and the insulating layer, wherein the second conducting film functions as a second conducting electrode;
forming an encapsulating layer overlaying at least the second conducting electrode.

As an example, the method further comprises performing a patterning process on the second conducting electrode to remove the portion of the second conducting electrode located directly above the first signal electrode and the second signal electrode.

As an example, the method further comprises forming a hole transmission layer between the first conducting electrode and the EL layer, and forming an electron transmission layer between the second conducting electrode and the EL layer.

A third aspect of the invention provides a touch display device comprising: a plurality of display elements arranged in an array, wherein each of the display elements comprises a pixel element surrounded by a gate line and a data line, and the pixel elements comprises any of the above-described OLED.

As an example, the touch display device further comprises a plurality of first sensing lines arranged parallel to each other and a plurality of second sensing lines arranged parallel to each other, the first sensing lines and the second sensing lines intersect with each other but are not electrically connected with each other, the first signal electrode of the OLED is electrically connected to the first sensing lines, the second signal electrode of the OLED is electrically connected to the second sensing lines.

As an example, the first sensing lines are in the same layer as the data line, the second sensing lines are in the same layer as the gate line.

As an example, the first sensing lines are in the same layer as the gate line, the second sensing lines are in the same layer as the data line.

A fourth aspect of the invention provides a method for fabricating a touch display device comprising:

forming a metal conducting film on a substrate and forming a gate electrode, a gate line and a longitudinal sensing line through a patterning process;

forming a gate insulating layer overlaying the substrate;

forming an active layer on the gate insulating layer;

forming a metal conducting film on the substrate and forming a source electrode, a drain electrode, a data line and a transversal sensing line through a patterning process;

forming a passivation layer overlaying the substrate;

forming via holes going through the passivation layer above the drain electrode, the transversal sensing line and the longitudinal sensing line;

forming a first conducing film on the passivation layer and forming a pixel electrode functioning as a first conducting electrode as well as a first signal electrode and a second signal electrode through a single patterning process, wherein the pixel electrode is electrically connected to the drain electrode through the via hole above the drain electrode, the first signal electrode is electrically connected to the transversal sensing line through the via hole above the transversal sensing line, the second signal electrode is electrically connected to the longitudinal sensing line through the via hole above the longitudinal sensing line;

forming an insulating layer overlaying the pixel electrode as well as the first signal electrode and the second signal electrode;

forming a via hole in the insulating layer above the pixel electrode;

forming an EL layer in the via hole;

forming a second conducting film overlaying the EL layer and the insulating layer, wherein the second conducting film functions as a second conducting electrode;

forming an encapsulating layer overlaying at least the second conducting electrode.

As an example, the method further comprises performing a patterning process on the second conducting electrode to remove the portion of the second conducting electrode located directly above the first signal electrode and the second signal electrode.

As an example, the method further comprises:

forming a hole transmission layer between the first conducting electrode and the EL layer; and forming an electron transmission layer between the second conducting electrode and the EL layer.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

Unless otherwise defined, all the technical and scientific terms used herein have the same meanings as commonly understood by one of ordinary skill in the art to which the present invention belongs. The terms "first," "second," etc., which are used in the description and the claims of the present application for invention, are not intended to indicate any sequence, amount or importance, but distinguish various components. Also, the terms such as "a," "an," etc., are not intended to limit the amount, but indicate the existence of at lease one. The terms "comprises," "comprising," "includes," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

Figure 1:
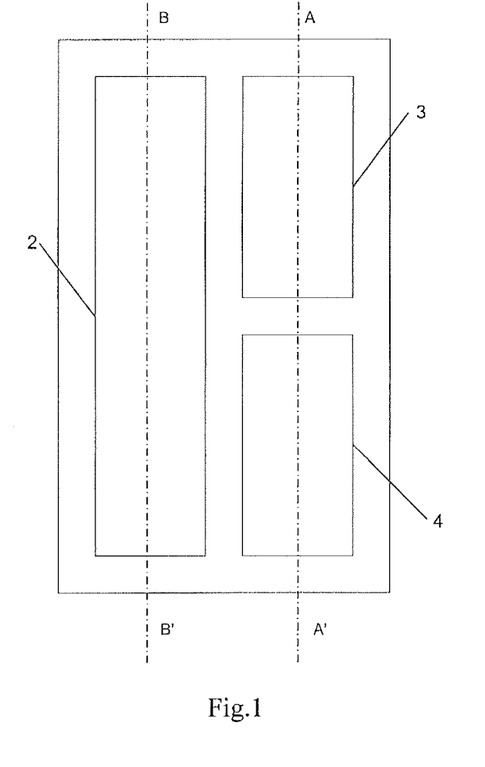
FIG. 1 schematically illustrates a top view of an OLED in accordance with an embodiment of the invention.
Figure 2:
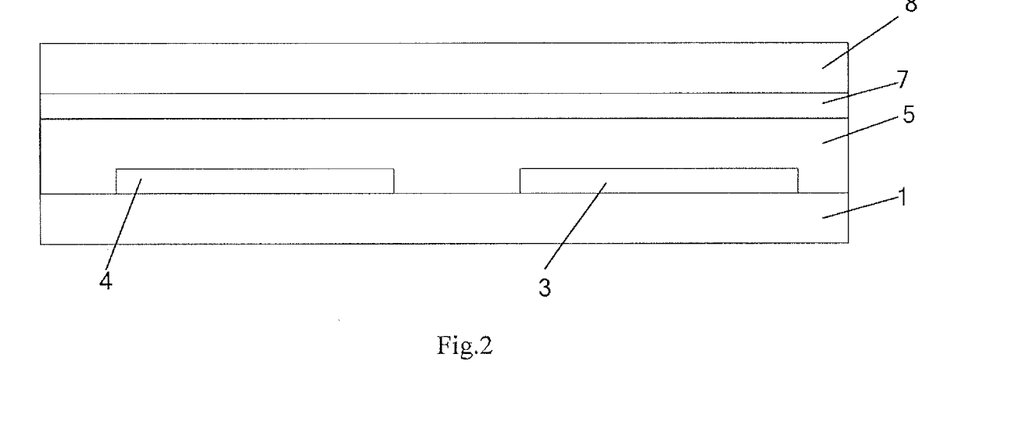
FIG. 2 schematically illustrates a cross section of the OLED taken along line A-A' of FIG. 1 in accordance with the embodiment of the invention.
Figure 3:
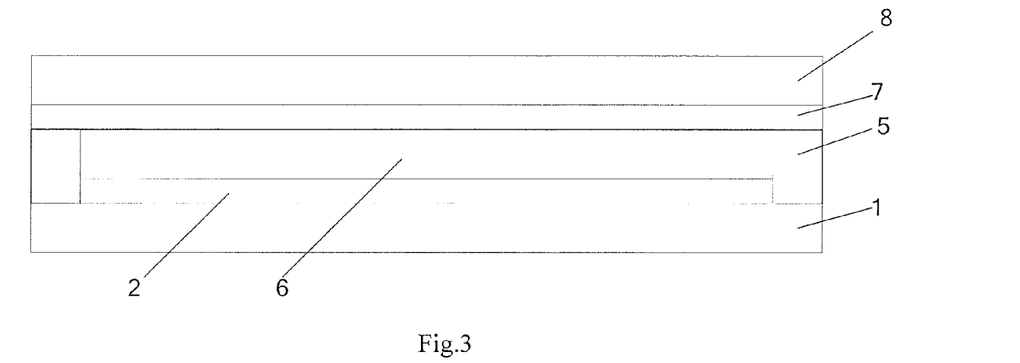
FIG. 3 schematically illustrates a cross section of the OLED taken along line B-B' of FIG. 1 in accordance with the embodiment of the invention.

As illustrated in FIGS. 1, 2 and 3 (in which FIG. 2 is a cross section of an OLED taken along line A-A' of FIG. 1 and FIG. 3 is a cross section of the OLED taken along line B-B' of FIG. 1), the OLED as provided by an embodiment of the invention comprises:

a substrate 1; a pixel electrode 2 functioning as a first conducting electrode on the substrate 1, a first signal electrode 3 and a second signal electrode 4 disposed on the same layer as the pixel electrode 2. The first signal electrode 3 is used for connecting a first sensing line which extends longitudinally and the second signal electrode 4 is used for connecting a second sensing line which extends transversally, the first sensing line and the second sensing line intersect with each other but are not electrically connected (the first and second sensing lines are not illustrated in the figures) with each other; an insulating layer 5 overlaying the first signal electrode 3 and the second signal electrode 4, an electroluminescent (EL) layer 6 overlaying the pixel electrode 2, a laminated layer of the EL layer 6 and the pixel electrode 2 is in the same layer as the insulating layer 5 (that is, an upper surface of the EL layer 6 is at the same height as an upper surface of the insulating layer 5, as shown in FIG. 3); a second conducting electrode 7 overlaying at least the EL layer 6; and an encapsulating layer 8 overlaying at least the second conducting electrode 7.

Those skilled in the art would understand that the drawings are illustrative only. Moreover, the terms "longitudinally", "longitudinal", "transversally" and "transversal" are only used to illustrate relative position relationship of the first sensing line and the second sensing line. Therefore, it can be understood that if the first sensing line is a longitudinal sensing line then the second sensing line is a transversal sensing line; on the contrary, if the first sensing line is a transversal sensing line then the second sensing line is a longitudinal sensing line. As for positions in the planar view as illustrated in FIG. 1, the first signal electrode 3 may be disposed above or below the second signal electrode 4.

Optionally, the first conducting electrode, i.e., the pixel electrode 2, is an anode of an OLED, and the second conducting electrode 7 is a cathode of the OLED. The OLED further comprising a hole transmission layer disposed between the anode and the EL layer and an electron transmission layer disposed between the cathode and the EL layer.

The insulating layer 5 may be an organic insulating layer.

Figure 4:
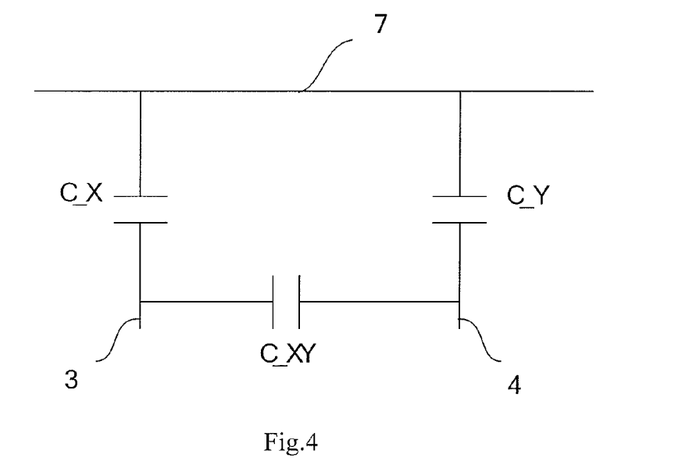
FIG. 4 is an equivalent circuit of a projected capacitance of the OLED in accordance with the embodiment of the invention.
Figure 5:
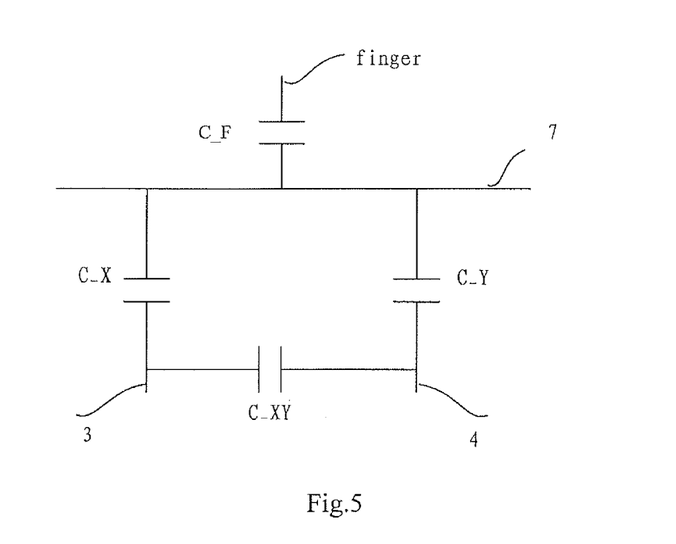
FIG. 5 is an equivalent circuit of a projected capacitance of the OLED when being touched in accordance with the embodiment of the invention.

In the embodiment, the second conducting electrode 7 forms projected capacitors with the first signal electrode 3 and the second signal electrode 4 respectively, with an equivalent circuit as shown in FIG. 4, where C_X indicates a capacitor formed between the second conducting electrode 7 and the first signal electrode 3, C_Y indicates a capacitor formed between the second conducting electrode 7 and the second signal electrode 4, C_XY indicates a capacitor formed between the first signal electrode 3 and the second signal electrode 4. When a finger touches the encapsulating layer 8 above the second conducting electrode 7, a capacitor C_F is formed between the finger and the second conductor electrode 7, with an equivalent circuit as illustrated in FIG. 5. The cathode of the OLED (i.e. the second conducting electrode 7) provides a DC voltage signal which remains constant, therefore, when the overall capacitance changes due to the introduction of the capacitor C_F, that is, the equivalent circuit changes from FIG. 4 to FIG. 5, voltage signals on the first signal electrode 3 and the second signal electrode 4 are changed (this is because the finger can be seen as the ground, in this case, charges on the capacitors C_X and C_Y will be charged to the capacitor C_F, thereby changing the voltage on the first signal electrode 3 and the second signal electrode 4). This principle can be used to determine whether the OLED is being touched.

Figure 6:
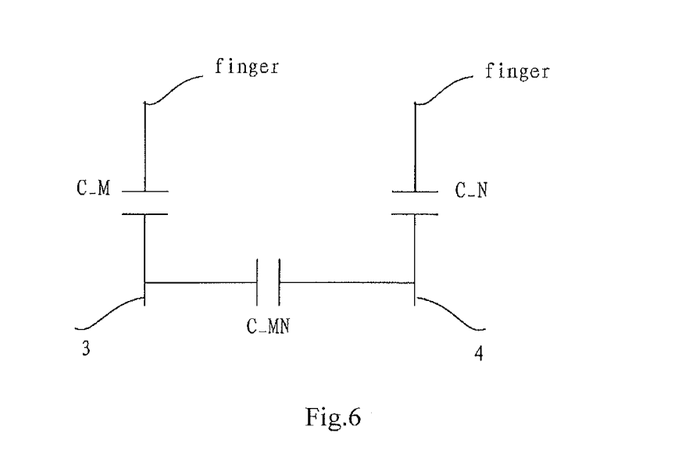
FIG. 6 is an equivalent circuit of a projected capacitance of an OLED when being touched in accordance with another embodiment of the invention.

Furthermore, a portion of the second conducting electrode 7 located directly above the first signal electrode 3 and the second signal electrode 4 is removed (which is not illustrated in the figures), such that the encapsulating layer 8 is formed directly on the insulating layer 5 above the first signal electrode 3 and the second signal electrode 4 (i.e., formed in the removed portion of the second conducting electrode 7). In this case, no capacitor is formed between the second conducting electrode 7 and the first signal electrode 3 as well as the second signal electrode 4. When touched, due to that an area of a touching object is generally larger than an area of the a single pixel element, the touching object forms capacitors with the first signal electrode 3 and the second signal electrode 4 respectively, with an equivalent circuit as illustrated in FIG. 6 (in which the touching object is exemplarily illustrated as a finger), where C_M indicates a capacitor formed between the finger and the first signal electrode 3, C_N indicates a capacitor formed between the finger and the second signal electrode 4, and C_MN indicates a capacitor formed between the first signal electrode 3 and the second signal electrode 4. The touch changes the current signals on the first signal electrode 3 and the second signal electrode 4, which can be used to determine whether the OLED is being touched.

With the OLED provided by the embodiment of the invention, the projected capacitance used for touch is simultaneously formed during the fabrication of the OLED, two separate signal sensing elements in the longitudinal and transversal directions are formed for each of pixel elements, which can improve the touch sensitivity of the product. Moreover, the product cost is reduced due to the signal electrodes as the projected capacitance and the pixel electrode of the LED are formed in the same layer.

Figure 7:
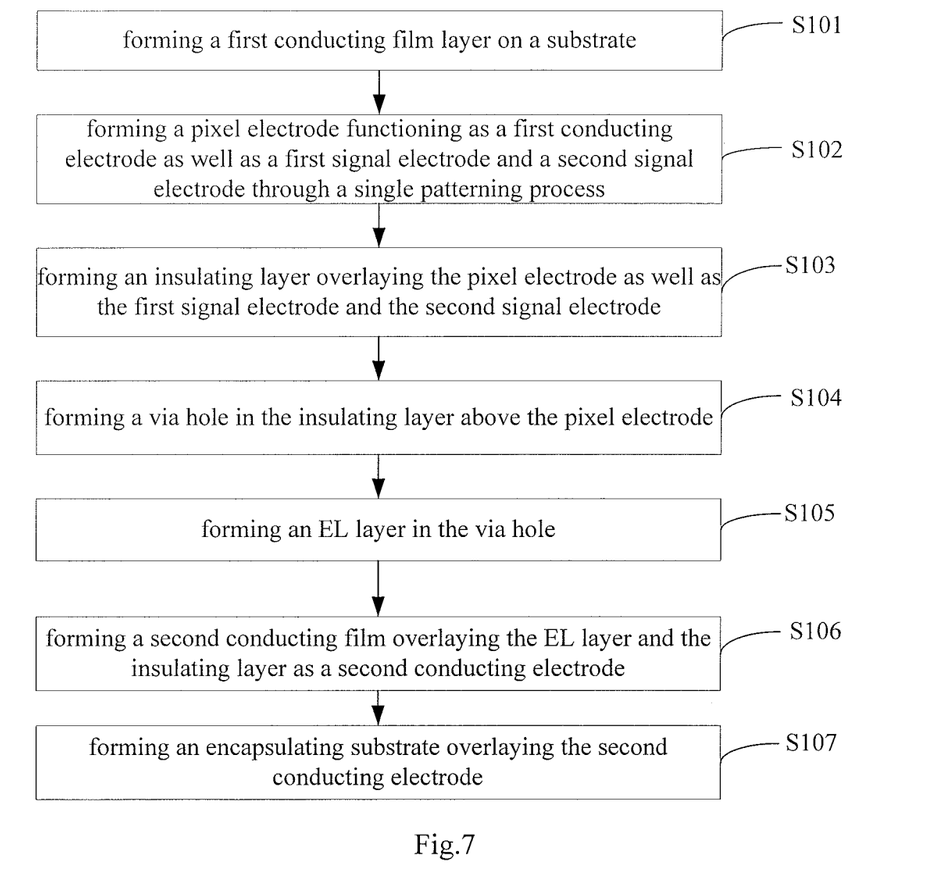
FIG. 7 schematically illustrates a flow chart of a method for fabricating an OLED in accordance with an embodiment of the invention.

As illustrated in FIG. 7, an embodiment of the invention provides a method for fabricating an OLED. Generally, the fabrication method comprises a step of forming a first and a second electrode layers and an EL layer sandwiched between the first and second electrode layers as well as a step of forming a first and a second signal electrodes and an insulating layer. As an example, the method comprises the following steps:

S101: forming a first conducting film layer on a substrate;

S102: forming a pixel electrode functioning as a first conducting electrode as well as a first signal electrode and a second signal electrode through a single patterning process.

For example, a first conducting film layer may be formed on the whole surface of a substrate, the first conducting film is made from conducting material with a thickness of 100 Å to 1000 Å. Then, a layer of photoresist is applied on the first conducting film, and the pixel electrode, the first signal electrode and the second electrode are formed by using a mask to perform patterning processes including exposing, developing, etching and peeling.

S103: forming an insulating layer overlaying the pixel electrode as well as the first signal electrode and the second signal electrode.

For example, an insulting layer with a thickness of 1000 Å to 6000 Å may be continuously deposited on the substrate using Chemical Evaporation Deposition (CVD). The insulating layer is for example an organic insulating layer and the layer may be formed through conventional method, such as deposition, spin-coating or roller coating.

S104: forming a via hole in the insulating layer above the pixel electrode.

S105: forming an EL layer in the via hole.

For example, the substrate is placed in a vacuum chamber and multiple organic films are deposited above the pixel electrode to form the EL layer, where an average thickness of the films is 350 Å±25 Å.

Optionally, it may further comprising the following before step S105: forming a hole transmission layer between the first conducting electrode and the EL layer, and a material of the hole transmission layer is for example aromatic diamine, such as N,N,N',N'-tetraphenyl-1,1'-biphenyl-4,4'-diamine (TPD), $C_{73}H_{52}N_4$ (TAD) and the like.

Optionally, it may further comprising the following after step S105: forming an electron transmission layer between the second conducting electrode and the EL layer, and a material of the electron transmission layer is for example 8-hydroxyquinoline aluminum (Alq3), 8-hydroxyquinoline zinc (Znq2) and the like.

S106: forming a second conducting film overlaying the EL layer and the insulating layer as a second conducting electrode.

It is noted that when an electron transmission layer is formed between the second conducting electrode and the EL layer, the second conducting electrode formed in step S106 overlays the electron transmission layer.

Optionally, the step S106 may further comprising: performing a patterning process on the second conducting electrode to remove the portion of the second conducting electrode located directly above the first and second signal electrodes. An equivalent circuit of the OLED formed with this optional step is illustrated in FIG. 6. The optional step can also be performed with the patterning process for forming the second conducting electrode and no additional exposing process is required.

S107: forming an encapsulating layer overlaying the second conducting electrode.

In the method for fabricating the OLED as provided by the embodiment of the invention, the projected capacitance used for touch is simultaneously formed during the fabrication of the OLED, two separate signal sensing elements in the longitudinal and transversal directions are formed for each of pixel elements, which can improve the touch sensitivity of the product. Moreover, the product cost is reduced due to the signal electrodes as the projected capacitance and the pixel electrode of the LED are formed in the same layer.

Figure 8:
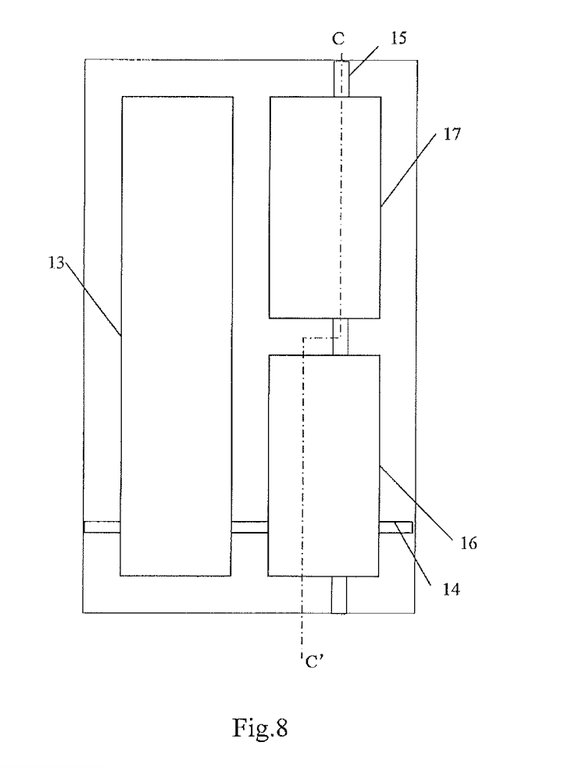
FIG. 8 schematically illustrates a top view of a touch screen device in accordance with an embodiment of the invention.
Figure 9:
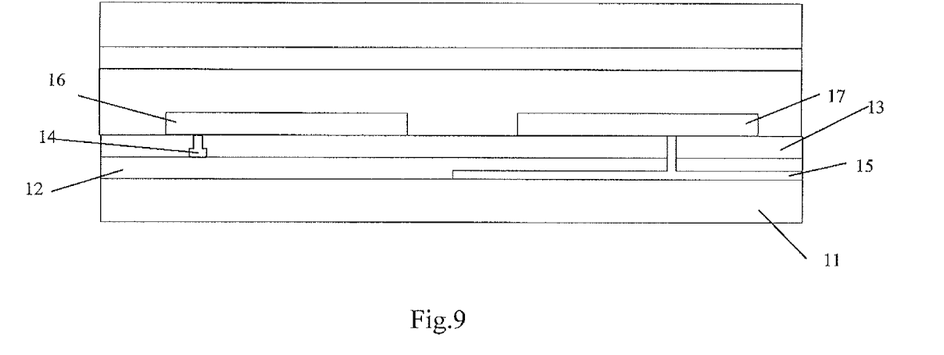
FIG. 9 schematically illustrates a cross section of the touch screen device taken along line C-C' of FIG. 7 in accordance with an embodiment of the invention.

Another embodiment of the invention further provides a touch display device as illustrated in FIGS. 8 and 9 (FIG. 9 schematically illustrates a cross section of the touch display device taken along line C-C' of FIG. 8), which comprises: a plurality of display elements arranged in an may, and each display element comprises a pixel element surrounded by a gate line and a data line, pixel elements of at least a part of the display elements comprise the OLED provided by the above embodiment. The touch display device further comprising a plurality of first sensing lines 14 arranged parallel to each other and a plurality of second sensing lines 15 arranged parallel to each other, the first sensing lines 14 and the second sensing lines 15 intersect with each other but are not electrically connected to each other. A first signal electrode 16 of the OLED is electrically connected to the first sensing lines 14, a second signal electrode 17 of the OLED is electrically connected to the second sensing lines 15. Preferably, the first signal electrode 16 is electrically connected to the first sensing lines 14 through a via hole, and the second signal electrode 17 is electrically connected to the second sensing lines 15 through another via hole.

Generally, each pixel element may further comprising a TFT on a substrate 11, a passivation layer 13 overlaying the TFT, an OLED electrically connected to a drain electrode of the TFT through a via hole of the passivation layer 13. The pixel electrode of the OLED, which functioning as the first conducting electrode, is connected to the drain electrode.

Optionally, the first sensing line is in the same layer as the data line, the second sensing line is in the same layer as the gate line. That is, the first sensing line is disposed between the passivation layer 13 and the gate insulating layer 12 overlaying the gate of the TFT, the second sensing line is disposed between the substrate 11 and the gate insulating layer 12.

Alternatively, the first sensing line is in the same layer as the gate line, the second sensing line is in the same layer as the data line. That is, the second sensing line is disposed between the passivation layer and the gate insulating layer overlaying the gate of the TFT, the first sensing line is disposed between the substrate and the gate insulating layer (not shown in the figure).

According to the working principle of the OLED with the projected capacitance provided by the embodiment of the invention, due to that the first and second sensing lines intersect with each other but are not electrically connected with each other, when a touch happens above the cathode, the two sensing lines can generate voltage variation signals on the first and the second signal electrodes in the longitudinal and transversal directions (for example, in the X and Y directions) which are vertical to each other, thereby locating the touch position.

In the touch display device provided by the embodiment of the invention, the projected capacitance used for touch is simultaneously formed during the fabrication of the OLED, two separate signal sensing elements in the longitudinal and transversal directions are formed for each pixel elements, which can improve the touch sensitivity of the product. Moreover, the product cost is reduced due to the signal electrodes as the projected capacitance and the pixel electrode of the LED are formed in the same layer.

Furthermore, each display element of the embodiment may comprise three pixel elements of red, green and blue. The display element can surely have more pixel elements of other colors, though an example of a pixel element having three primitive colors of red, green and blue will be described exemplarily. Preferably, the OLED provided by the embodiment of the invention is selectively disposed in the three pixel elements of red, green and blue included in the display element. When the three pixel elements of red, green and blue have the same light-emitting area, brightness may differ from each other. As a result, the light-emitting areas of the three pixel elements of red, green and blue are configured proportionally to ensure the uniformity of the light-emitting brightness. As an example, for pixel elements with the same light-emitting area, a green light-emitting material produces a higher brightness. Therefore, the area of the EL layer of the green pixel element is generally reduced during fabrication. More preferably, the OLED provided by the embodiment of the invention is configured in the green pixel element. By this means, even if the signal electrode for forming the projected capacitance takes up a certain light-emitting area in the pixel electrode layer of the OLED, the influence on the brightness of the display device can be minimized. Naturally, it is also feasible for the red or blue pixel element to employ the OLED provided by the embodiment of the invention. More preferably, among all the green pixel elements, it may choose to dispose the touch capacitor in some of them according to actual requirements, such as resolution, sensing area and capacitor sensitivity and so on. That is, the number and position relationship of green pixel elements with the touch capacitor and those without the touch capacitor may be determined according to actual requirements.

Figure 10:
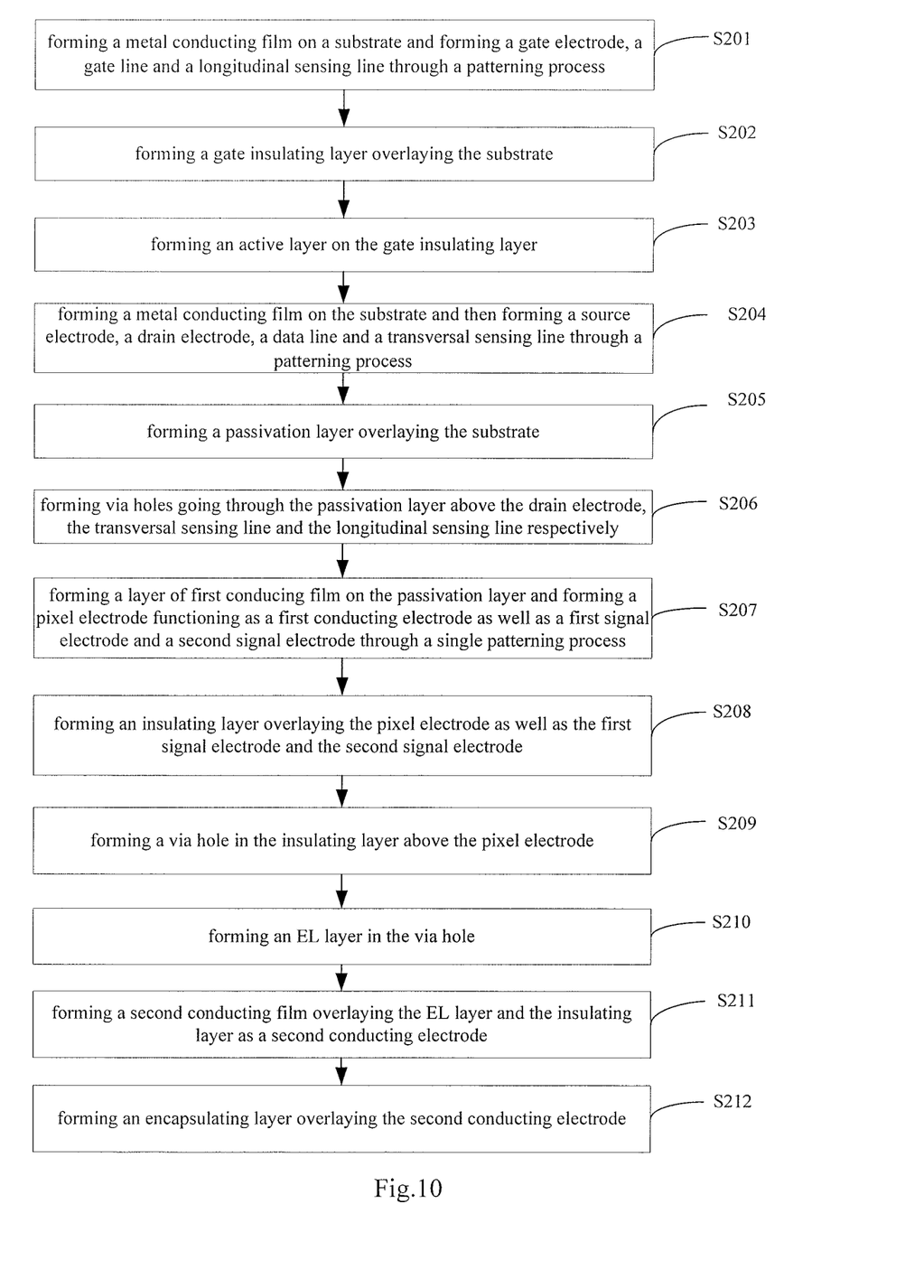
FIG. 10 schematically illustrates a flow chart of a method for fabricating a touch screen device in accordance with an embodiment of the invention.

Another embodiment of the invention provides a method for fabricating a touch display device. Generally, the fabrication method comprises a step of forming a first and a second electrode layers and an EL layer sandwiched between the first and second electrode layers, a step of forming a data line and a gate line as well as a step of forming a first and a second signal electrodes and an insulating layer. As an example, as illustrated in FIG. 10, the method comprises the following steps:

S201: forming a metal conducting film on a substrate and forming a gate electrode, a gate line and a longitudinal sensing line through a patterning process.

For example, a layer of metal conducting film with a thickness of 1000 Å to 7000 Å may be formed on a substrate by using magnetron sputtering. A metal material for fabricating the metal conducting film generally may be molybdenum, aluminum, aluminum nickel alloy, molybdenum tungsten alloy, chrome, copper etc. The metal conducting film may be a laminated film layer made of the above materials. Then, the gate electrode, the gate line and the longitudinal sensing line are formed on a certain area on the substrate by using a mask to perform patterning processes including exposing, developing, etching and peeling. The metal conducting films may be formed by means of Plasma Enhanced Chemical Vapor Deposition (PECVD), magnetron sputtering, thermal evaporation and other conventional method for fabricating film.

S202: forming a gate insulating layer overlaying the substrate.

For example, a film of a gate insulating layer with a thickness of 1000 Å to 6000 Å is continuously deposited on the substrate by using CVD. A material of the gate insulating layer is generally silicon nitride, but can also be silicon oxide and silicon oxynitride. The film of the gate insulating layer may be formed by conventional fabricating method, such as, deposition, spin-coating or roller-coating.

S203: forming an active layer on the gate insulating layer.

For example, an amorphous silicon (a-Si) film and an n+ amorphous silicon film with a total thickness of 1000 Å to 6000 Å may be deposited on the gate insulating layer using CVD. Alternatively, a metal oxide semiconductor film may be deposited on the gate insulating layer. A mask for the active layer may be used to expose the a-Si film, which is then dry etched to form an active layer on the gate insulating layer. Furthermore, if it is the metal oxide semiconductor film that is deposited on the gate insulating layer as the active layer, then the active layer may be formed through a patterning process on the metal oxide semiconductor film. That is, after applying photoresist, a mask may be used to expose, develop and etch the metal oxide semiconductor film to form the active layer.

S204: forming a metal conducting film on the substrate and then forming a source electrode, a drain electrode, a data line and a transversal sensing line through a patterning process.

For example, similar to the method of fabricating the gate electrode, a metal conducting film with a thickness of 1000 Å to 7000 Å may be formed on the substrate. A metal material for fabricating the metal conducting film generally may be molybdenum, aluminum, aluminum nickel alloy, molybdenum tungsten alloy, chrome, copper etc. The metal conducting film may be a laminated film layer made of the above materials. Then, the source electrode, the drain electrode, the data line and the transversal sensing line are formed by using a mask to perform patterning processes including exposing, developing, etching and peeling. The films may be formed by means of PECVD, magnetron sputtering, thermal evaporation and other conventional method for fabricating film.

S205: forming a passivation layer overlaying the substrate.

For example, a passivation layer with a thickness of 1000 Å to 6000 Å is deposited on the whole surface of the substrate. A material of the passivation layer may be oxide such as silicon dioxide. In this case, the passivation layer overlays the gate electrode, the source electrode, the drain electrode, the second sensing line or the first sensing line.

S206: forming via holes going through the passivation layer above the drain electrode, the transversal sensing line and the longitudinal sensing line respectively.

S207: forming a layer of first conducing film on the passivation layer and forming a pixel electrode functioning as a first conducting electrode as well as a first signal electrode and a second signal electrode through a single patterning process.

The pixel electrode is electrically connected to the drain electrode through the via hole above the drain electrode, the first signal electrode is electrically connected to a first sensing line through the via hole above the first sensing line, a second signal electrode is electrically connected to the second sensing line through the via hole above the second sensing line. The first sensing line is the transversal sensing line and the second sensing line is the longitudinal sensing line. Alternatively, the second sensing line is the transversal sensing line and the first sensing line is the longitudinal sensing line. It can be understood that the terms "longitudinal" and "transversal" means relative positions and only used to illustrate relative position relationship of the first sensing line and the second sensing line. Therefore, it can be understood that if the first sensing line is a longitudinal sensing line then the second sensing line is a transversal sensing line; on the contrary, if the first sensing line is a transversal sensing line then the second sensing line is a longitudinal sensing line.

For steps following S207 please refer to S101 to S107, which will not be elaborated here.

S208: forming an insulating layer overlaying the pixel electrode as well as the first signal electrode and the second signal electrode.

S209: forming a via hole in the insulating layer above the pixel electrode.

S210: forming an EL layer in the via hole.

For example, the substrate is placed in a vacuum chamber and multiple organic films are deposited above the pixel electrode to form the EL layer, where an average thickness of the films is 350 Å±25 Å.

Figure 11:
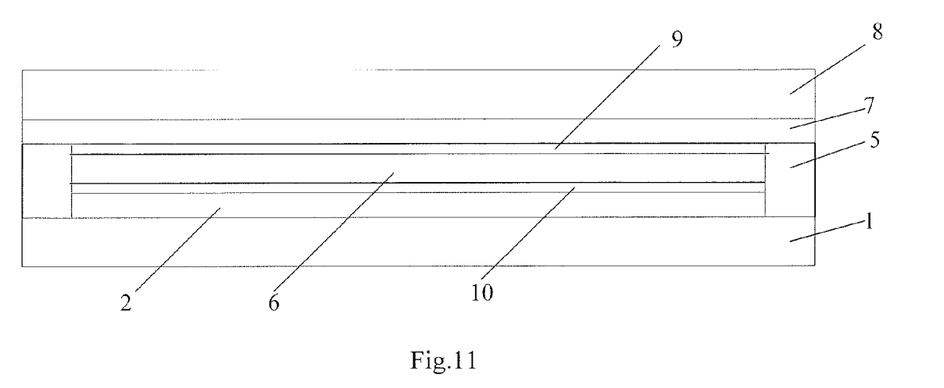
FIG. 11 schematically illustrates a hole transmission layer and a electron transmission layer of a touch screen device in accordance with an embodiment of the invention.

Optionally, it may further comprising the following before step S210: forming a hole transmission layer between the first conducting electrode and the EL layer, and a material of the hole transmission layer is for example aromatic diamine, such as N,N,N',N'-tetraphenyl-1,1'-biphenyl-4,4'-diamine (TPD), $C_{73}H_{52}N_4$ (TAD) and the like.

It may further comprising the following after step S210: forming an electron transmission layer between the second conducting electrode and the EL, where a material of the electron transmission layer is 8-Hydroxyquinoline aluminum (Alq3), 8-Hydroxyquinoline zinc (Znq2) and the like.

S211: forming a second conducting film overlaying the EL layer and the insulating layer as a second conducting electrode.

It is noted that when an electron transmission layer is formed between the second conducting electrode and the EL layer, the second conducting electrode formed in step S211 overlays the electron transmission layer.

Optionally, step S211 may further comprising: performing a patterning process on the second conducting electrode to remove the portion of the second conducting electrode located directly above the first and second signal electrodes. An equivalent circuit of the OLED formed with this optional step is illustrated in FIG. 6. The optional step can also be performed with the patterning process for forming the second conducting electrode and no additional exposing process is required.

S212: forming an encapsulating layer overlaying the second conducting electrode.

In the method for fabricating the touch display device as provided by the embodiment of the invention, the projected capacitance used for touch is simultaneously formed during the fabrication of the OLED, two separate signal sensing elements in the longitudinal and transversal directions are formed for each pixel elements, which may improves the sensitivity of the touch screen product. Moreover, the product cost is reduced due to the signal electrodes as the projected capacitance and the pixel electrode of the LED are formed in the same layer.

What are described above is related to the illustrative embodiments of the disclosure only and not limitative to the scope of the disclosure; the scopes of the disclosure are defined by the accompanying claims.

What is claimed is:

1. An organic light emitting diode, comprising:
a substrate;
a pixel electrode functioning as a first conducting electrode on the substrate;
a first signal electrode and a second signal electrode disposed on the same layer as the pixel electrode, wherein the first signal electrode is connected to a first sensing line, the second signal electrode is electrically connected to a second sensing line, and the first sensing line and the second sensing line intersect with each other but are not electrically connected with each other;
an insulating layer overlaying the first signal electrode and the second signal electrode,
an EL layer overlaying the pixel electrode, a laminated layer of the EL layer and the pixel electrode is in the same layer as the insulating layer;
a second conducting electrode overlaying at least the EL layer; and
an encapsulating layer overlaying at least the second conducting electrode.

2. The organic light emitting diode of claim 1, wherein the first conducting electrode is an anode of the organic light emitting diode, and the second conducting electrode is a cathode of the organic light emitting diode.

3. The organic light emitting diode of claim 2, further comprising a hole transmission layer disposed between the anode and the EL layer.

4. The organic light emitting diode of claim 3, wherein a portion of the second conducting electrode located directly above the first signal electrode and the second signal electrode is removed.

5. The organic light emitting diode of claim 2, further comprising an electron transmission layer disposed between the cathode and the EL layer.

6. The organic light emitting diode of claim 5, wherein a portion of the second conducting electrode located directly above the first signal electrode and the second signal electrode is removed.

7. The organic light emitting diode of claim 2, wherein a portion of the second conducting electrode located directly above the first signal electrode and the second signal electrode is removed.

8. The organic light emitting diode of claim 1, wherein the insulating layer is an organic insulating layer.

9. The organic light emitting diode of claim 8, wherein a portion of the second conducting electrode located directly above the first signal electrode and the second signal electrode is removed.

10. The organic light emitting diode of claim 1, wherein a portion of the second conducting electrode located directly above the first signal electrode and the second signal electrode is removed.

11. A touch display device comprising: a plurality of display elements arranged in an array, wherein each of the display elements comprises a pixel element surrounded by a gate line and a data line, wherein the pixel elements in at least a part of the display elements comprise the OLED of claim 1; the touch display device further comprising: a plurality of first sensing lines arranged parallel to each other and a plurality of second sensing lines arranged parallel to each other, wherein the first sensing lines and the second sensing lines intersect with each other but are not electrically connected with each other, the first signal electrode of the OLED is electrically connected to the first sensing lines, and the second signal electrode of the OLED is electrically connected to the second sensing lines.

12. The touch display device of claim 11, wherein the first sensing lines are in the same layer as the data line, the second sensing lines are in the same layer as the gate line.

13. The touch display device of claim 11, wherein the first sensing lines are in the same layer as the gate line, the second sensing lines are in the same layer as the data line.

* * * * *